(12) United States Patent
Rumsby (10) Patent No.: US 9,099,511 B2
(45) Date of Patent: Aug. 4, 2015

(54) APPARATUS AND METHOD FOR PROCESSING LONG, CONTINUOUS FLEXIBLE SUBSTRATES

(75) Inventor: Philip Thomas Rumsby, Oxon (GB)

(73) Assignee: M-SOLV LIMITED, Oxford (GB)

( * ) Notice: Subject to any disclaimer, the term of this patent is extended or adjusted under 35 U.S.C. 154(b) by 624 days.

(21) Appl. No.: 13/501,515

(22) PCT Filed: Oct. 13, 2009

(86) PCT No.: PCT/GB2009/002445
§ 371 (c)(1),
(2), (4) Date: May 9, 2012

(87) PCT Pub. No.: WO2011/045551
PCT Pub. Date: Apr. 21, 2011

(65) Prior Publication Data
US 2012/0219340 A1    Aug. 30, 2012

(51) Int. Cl.
| | |
|---|---|
| *B41J 15/00* | (2006.01) |
| *H01L 21/677* | (2006.01) |
| *B23K 26/08* | (2014.01) |
| *H01L 21/67* | (2006.01) |
| *H01L 31/20* | (2006.01) |

(52) U.S. Cl.
CPC ...... *H01L 21/67739* (2013.01); *B23K 26/0846* (2013.01); *H01L 21/6715* (2013.01); *H01L 31/206* (2013.01); *Y02E 10/50* (2013.01)

(58) Field of Classification Search
CPC .............. B23K 26/0846; H01L 31/206; H01L 21/67739; H01L 21/6715
USPC .................... 400/76, 618, 611, 619; 399/205; 101/DIG. 42, 200, 197
See application file for complete search history.

(56) References Cited

U.S. PATENT DOCUMENTS

| | | | |
|---|---|---|---|
| 5,334,815 A | 8/1994 | MacNaughton et al. | |
| 7,219,708 B2 * | 5/2007 | Yamamoto et al. | 156/361 |
| 8,118,584 B2 * | 2/2012 | Yukawa et al. | 425/369 |
| 8,720,333 B2 * | 5/2014 | Henn et al. | 101/228 |
| 8,721,022 B2 * | 5/2014 | Izawa et al. | 347/16 |
| 8,857,974 B2 * | 10/2014 | Izawa et al. | 347/104 |
| 2001/0022143 A1 * | 9/2001 | Stern | 101/248 |
| 2004/0074407 A1 * | 4/2004 | Iyokawa et al. | 101/228 |
| 2004/0144272 A1 * | 7/2004 | Kolbe et al. | 101/228 |
| 2006/0055730 A1 * | 3/2006 | Ono et al. | 347/36 |
| 2006/0093794 A1 * | 5/2006 | Yukawa et al. | 428/180 |

(Continued)

FOREIGN PATENT DOCUMENTS

| | | |
|---|---|---|
| GB | 2458986 A | 10/2009 |
| JP | 2000 235267 A | 8/2000 |
| WO | WO-2006/036017 A1 | 4/2006 |

*Primary Examiner* — David Banh
(74) *Attorney, Agent, or Firm* — Harness, Dickey & Pierce, P.L.C.

(57) ABSTRACT

An apparatus and method is described that allows accurately registered, high resolution patterning of thin films on discrete lengths of flexible substrate material that are unwound from a drum and after processing are rewound onto another drum. Discrete lengths of the substrate—are clamped to a chuck and the chuck moved in a direction parallel to the length of the substrate. Accommodating units are provided for accommodating length changes in the substrate both upstream and downstream of the chuck. A processing head is moved across the width of the substrate when clamped to the chuck and pattern formation is by one, or a combination, of laser ablation, laser exposure or ink jet printing using either or both subtractive and additive processes.

16 Claims, 2 Drawing Sheets

(56) References Cited

U.S. PATENT DOCUMENTS

| | | | |
|---|---|---|---|
| 2007/0126832 A1* | 6/2007 | Kito | 347/101 |
| 2007/0148827 A1 | 6/2007 | Kojima | |
| 2008/0031640 A1* | 2/2008 | Fukui | 399/9 |
| 2008/0158278 A1 | 7/2008 | Inoue | |
| 2008/0246822 A1* | 10/2008 | Hara | 347/84 |
| 2009/0207225 A1* | 8/2009 | Matsuhashi | 347/102 |
| 2010/0243126 A1* | 9/2010 | Strunk | 156/64 |
| 2012/0241419 A1* | 9/2012 | Rumsby | 219/121.6 |

* cited by examiner

APPARATUS AND METHOD FOR PROCESSING LONG, CONTINUOUS FLEXIBLE SUBSTRATES

CROSS-REFERENCE TO RELATED APPLICATIONS

This application is a 371 U.S. National Stage of International Application No. PCT/GB2009/002445, filed on Oct. 13, 2009, the disclosure of which is herein incorporated by reference in its entirety.

TECHNICAL FIELD

This invention relates to apparatus and a method for creating fine scale, accurately registered, patterns in multi layer thin films on continuous lengths of flexible non-woven substrates that are unwound from a drum and after processing are rewound onto a drum. The substrate is processed in discrete, defined lengths by mask less, direct write methods capable of two dimension patterning. Specifically the method is appropriate for the formation of electrical interconnects and dielectric components on and between the multilayer thin films found in flexible displays, photovoltaic panels and other microelectronic devices.

BACKGROUND ART

The packaging and printing industries have used reel to reel process methods for applying printing inks onto long lengths of flexible polymer and paper material for many years. In this case the so called web of material is moved continuously and repeating ink patterns are applied to selected regions by various roller transfer processes such as flexography, offset printing and gravure printing. The transfer roller diameter sets the maximum repeat pitch of the pattern along the web flow direction. Recently, with the growing demand for low cost, flexible electronic devices, continuous reel to reel processes using flexographic and offset printing of inks with electronic functionality have been developed. These "on the fly" printing processes where the web is continuously moving and the unwind and rewind reels are continually operated are very fast and can apply ink patterns at web speeds up to many hundreds of meters per minute. There is, however, limited flexibility to change product material and design and minimum line width that can be reliably printed and have relatively poor registration accuracy to existing patterns on the substrate and consequently they are not suitable for the patterning of the most advanced multi-layer flexible microelectronic devices that are now required. In this case minimum linewidths of a few tens of microns and registration accuracies better than this are needed. Another disadvantage of these types of continuous printing processes is that because of the requirement to create a structured plate or roller to define the ink pattern they are only appropriate for very long process runs.

The microelectronic and medical industries also use reel to reel process methods to manufacture flexible electronic devices such as solar panels and sensors. In this case higher registration accuracy is often needed and the technique of screen printing is one method that is often used to achieve this. In this case a defined length of the flexible substrate is drawn from a drum and supported on a process chuck. A suitable masking screen is registered to the substrate and then an excess of ink which usually has some electronic functionality is administered and forced through the screen mask by the one dimensional motion of a blade over the length of the chuck to define the required pattern. Because of the requirement to contact the screen to the substrate both items are held stationary during the printing cycle while the blade moves across the screen. Hence screen printing is not a continuous process but operates on discrete substrate areas and the unwind and rewind reels are generally operated intermittently or web accumulator units are disposed each side of the screen printer to allow the rest of the production line and the unwind and rewind reels to operate continuously. Screen printing is limited to minimum line widths of about 100 µm so is unable to be used for advanced flexible micro-electronic devices where line widths down to tens of microns are required. In addition because of the requirement to create a screen to define the pattern, screen printing is more suitable for long repetitive process runs.

For short process runs the requirement to create a screen or patterned roller or plate every time the pattern design is changed is a serious hindrance. This limitation has been overcome by the introduction of mask less printing processes based on drop on demand ink jet printing applied to both electronically functional and decorative inks. In this process a print head with a row or rows of nozzles is moved back and forth over the substrate in a two dimensional raster trajectory to cover a defined area. The firing of ink droplets from the nozzles is activated at appropriate times by electrical pulses so that the required pattern is defined in the deposited ink. This type of printing is often referred to as "Digital Printing". It is much slower than the more classical printing methods described earlier but due to the droplet placement control can achieve much higher registration accuracy. Minimum linewidths below 50 µm are also achievable. Hence this type of printing has become the usual method for the printing of functional inks to make precision flexible micro-electronic devices.

When this type of ink jet printing process is applied to sheet substrates it is usual to place them on a chuck which moves the substrate in one axis while the ink jet head is set orthogonal to and moved in the other direction. Such "crossed axis" systems can be engineered to be fast, accurate and highly repeatable. When, however, ink jet printing is applied to continuous webs of flexible material it is usual to operate in a mode where the substrate is held stationary and the print head is moved in two dimensions over the full process area by means of a motorized double gantry system. Such arrangements lead to loss of speed, accuracy and repeatability compared to the "crossed axis" architecture.

All the printing methods discussed are additive pattern forming processes but for the case where the substrate has a thin film applied to the surface, subtractive processes involving pulsed laser ablation or laser exposure are often used for the formation of microelectronic devices. In these cases, to form the required pattern either pulsed lasers are used to selectively remove areas of or lines in the thin film coating by a the process of direct laser ablation or alternatively CW or quasi CW UV lasers are used to expose a resist layer with the required pattern which is then transferred into an underlying film by subsequent development and etching processes.

When these laser processes are used to pattern sheet substrates a variety of different methods are used to achieve the required relative motion between the laser and the substrate. For small substrates a stationary laser beam with the substrate moved in two axes on a chuck is most common. This is the most desirable arrangement in terms of delivering a beam from a stationary laser to the process head as the distance between the laser and the head is fixed. For large sheets, to minimize footprint, it is common to move the laser head in two axes over a stationary substrate. This is the least desirable arrangement in terms of delivering a beam from a stationary laser to the process head which in this case is moved over some distance in two axes as the path length can change significantly. A crossed axis approach, where the laser head moves in one axis and the substrate in the other, is generally the most common in terms of achieving the fastest head and substrate speeds and highest accuracy and repeatability and in having an acceptable optical solution to the one dimensional change to the path length between a stationary laser and a moving process head:

When, however, laser processing is applied to continuous webs of flexible material, because of the limitations caused by the associated unwind and rewind drums it is usual to operate in a mode where the substrate is held stationary and the process head is moved in two axes over the full process area by means of a motorized double gantry system. Such arrangements lead to loss of speed, accuracy and repeatability compared to the "crossed axis" architecture and suffer from beam delivery issues associated with the changing optical path lengths in two axes.

Hence in order to create the high resolution, accurately registered, patterns in the thin films required for the manufacture of flexible microelectronic devices by both additive and subtractive processes there is a requirement for apparatus that can move either ink jet heads or laser heads or both with respect to the surface of discrete lengths of accurately located sections of continuous web flexible substrates which are unwound from reels and rewound onto reels.

DISCLOSURE OF INVENTION

According to a first aspect of the invention, there is provided apparatus for processing long, continuous lengths of a flexible substrate in discrete defined lengths in order to form high resolution, two-dimensional patterns with a high, level of positional accuracy by direct writing on the substrate, said apparatus comprising;
  a. a dispensing unit for periodically dispensing a defined length of the flexible substrate from an unwind drum in a first direction while maintaining constant tension in the substrate in the first direction;
  b. a chuck onto which a discrete defined length of the substrate is periodically clamped for processing;
  c. a first accommodating unit for accommodating length changes in the first direction and maintaining constant tension in the first direction in the substrate upstream of the chuck;
  d. a first mechanism for accurately moving the chuck and attached discrete length of substrate backwards and forwards in the first direction one or more times over the full length of the discrete length of substrate;
  e. a processing unit mounted over the chuck for forming a high resolution two-dimensional pattern on the defined length of the substrate by a direct writing process;
  f. a second mechanism for accurately moving the process unit one or more times backwards and forwards in a second direction which is perpendicular to the first direction over the full width of the substrate;
  g. a second accommodating unit for accommodating length changes and maintaining constant tension in the first direction in the defined length of substrate downstream of the chuck;
  h. a rewinding unit for periodically rewinding a defined length of the flexible substrate onto a rewind drum in the first direction after processing while maintaining constant tension in the substrate in the first direction; and
  i. a control system arranged to control:
    i. periodic clamping of a discrete defined length of the substrate to the chuck for processing and movement of the chuck in the first direction while the unwind and rewind drums are stationary;
    ii. movement of the chuck and processing unit either by means of synchronous, continuous motion of both the chuck and the processing unit or by a series of continuous motions of one of the chuck and the processing unit in one direction combined with a series of intermittent motions of the other in the other direction;
    iii. operation of the processing unit;
    iv. periodic unclamping of the discrete defined length of substrate from the chuck and operation of the unwind and rewind drums so as to rewind the defined length of substrate onto the rewind drum and unwind a further defined discrete length of substrate from the dispensing drum.

Preferably, the apparatus has the following components:
a. a web unwind unit with associated web brake and tension control systems that has the ability to clamp the web substrate or periodically dispense a defined discrete length of unprocessed flexible web substrate from a cylindrical drum for processing;
b. a web length compensation unit that is able to accommodate all length changes and maintain constant tension in the discrete length of dispensed unprocessed substrate such that the degree of web elongation is defined;
c. a flat plate chuck which is attached to a servo motor driven stage that causes the chuck to move in the direction parallel to the web;
d. vacuum channels in the upper surface of the chuck for attaching a length of the unprocessed substrate during processing;
e. a process unit mounted over the chuck and attached to a servo motor driven stage that causes it to move across the width of the web;
f. one or more camera units attached to the process heads that are able to view the substrate top surface;
g. one or more laser, ink jet or other heads attached to the process unit arranged to operate on the top surface of the substrate on the chuck;
h. a second web length compensation unit that is able to accommodate all length changes and maintain constant tension in the discrete length of processed substrate such that the degree of web elongation is defined;
i. a web rewind unit and associated web brake and tension control systems that has the ability to clamp the web substrate or periodically take up a defined length of the flexible substrate and wind it onto a cylindrical drum after processing;
j. control systems that allows programmed, co-ordinated motion of the process unit and the chuck and operation of the web length compensators and the unwind and rewind units In operation, the apparatus preferably works as follows:—
a) the brakes on the unwind and rewind units are both released and both units operated so that a discrete length of the web substrate is advanced under tension control so that a defined length is positioned above the chuck;
b) vacuum is applied via channels, holes or pores in the chuck surface so that the defined length of substrate material is firmly clamped to the chuck surface;
c) the unwind and rewind drums are both stopped and the brakes applied;
d) both web length compensators are activated to take up and release the excess web material that arises at each side of the chuck due to motion of the chuck in the web direction;
e) the X and Y stages move the chuck and process unit so the camera unit attached to the process unit is able to locate the position of fiducial marks or other pattern references;

f) the exact positions of the reference marks are measured;
g) corrections are made in the stage control software to compensate for any measured angular or positional offsets of the substrate from a standard position;
h) the substrate on the chuck is processed by appropriate motion of the process head and chuck;
i) the chuck vacuum is released;
j) the unwind and rewind unit brakes are released and both are operated under tension control so the processed length of the substrate is moved from the chuck area;
k) steps a to i above are repeated.

According to a second aspect of the invention, there is provided a method of processing long, continuous lengths of a flexible substrate in discrete defined lengths to, form high resolution, two-dimensional patterns with a high level of positional accuracy by direct writing on the substrate, the method comprising;
a) operating a dispensing unit to periodically dispense a defined length of the flexible substrate from an unwind drum in a first direction while maintaining constant tension in the substrate in the first direction;
b) providing a chuck onto which a discrete defined length of the substrate is periodically clamped for processing;
c) accommodating length changes in the first direction and maintaining constant tension in the first direction in the substrate upstream of the chuck;
d) moving the chuck and attached discrete length of substrate backwards and forwards in the first direction one or more times over the full length of the discrete length of substrate;
e) providing a processing unit over the chuck to form a high resolution two-dimensional pattern on the defined length of the substrate by a direct writing process;
f) accurately moving the process unit one or more times backwards and forwards in a second direction which is perpendicular to the first direction over the full width of the substrate;
g) accommodating length changes and maintaining constant tension in the first direction in the defined length of substrate downstream of the chuck;
h) periodically rewinding a defined length of the flexible substrate onto a rewind drum in the first direction after processing while maintaining constant tension in the substrate in the first direction; and
i) providing a control system to control:
  i. periodic clamping of a discrete defined length of the substrate to the chuck for processing and movement of the chuck in the first direction while the unwind and rewind drums are stationary;
  ii. movement of the chuck and processing unit either by means of synchronous, continuous motion of both the chuck and the processing unit or by a series of continuous motions of one of the chuck and the processing unit in one direction combined with a series of intermittent motions of the other in the other direction;
  iii. operation of the processing unit; and
  iv. periodic unclamping of the discrete defined length of substrate from the chuck and operation of the unwind and rewind drums so as to rewind the defined length of substrate onto the rewind drum and unwind a further defined discrete length of substrate from the dispensing drum.

The web foil material used with this apparatus can be made of any flexible material suitable for supporting microelectronic or sensor devices. It is envisaged that in general the material will be a polymer such as polyester but foils of metal or paper can also be used. Foil thicknesses are generally envisaged to be in the few tens of microns to few hundreds of micron range but thicker foils are possible if they are required and are able to be processed from drums and thinner foils are also possible.

Web widths are envisaged to be in the range of a few hundred mm to over 1 m with lengths up to several km if required but narrower, wider and longer webs can also be used with the apparatus described.

The unwind and rewind units operate only when the substrate material is released from the chuck and are used to advance defined lengths of substrate for processing. While the substrate on the chuck is being processed the unwind and rewind units are held stationary under closed loop tension control and the web brakes applied. The drums on both units are driven by servo motors and have feedback from web tension sensors in order to maintain an appropriate tension in the web to control the elongation. It is envisaged that typical web advance distances, corresponding to discrete process area lengths will be in the range a few hundred mm up to one meter but other shorter and longer advance and process distances are also possible. An important point about this invention is that the apparatus is very flexible and that the process length can be changed by suitable programming of the motion of the unwind and rewind units. If these units unwind and rewind the same length of web each time they operate then the process length remains the same. If they are caused to rewind a different length to that unwound then the process length can be varied.

The architecture of the apparatus is of the so called crossed axis type with the process head moving in one axis-across the web and the substrate moving in an orthogonal axis along the web direction. Coverage of the full substrate area is carried out in either a) step and scan mode where the process unit and chuck stages both move intermittently, b) raster scan mode across the web where the process unit makes a series of continuous moves across the full web width and the chuck makes a series of step moves, that are less than the full travel, whenever the process unit has completed a pass across the web, c) raster scan mode along the web where the chuck makes a series of continuous moves along the full length of its travel and the process unit makes a series of step moves, that are less than the full web width, whenever the chuck has completed a full pass and d) vector write mode where both process unit and chuck stages operate at the same time in a coordinated manner.

When the apparatus is operating in any of these four modes and because the substrate is attached to the moving chuck there is a requirement to handle excess substrate material on each side of the chuck assembly. This is done by means of the two special high speed web length compensator units. One unit is situated between the chuck assembly and the unwind unit and the other unit is situated between the chuck assembly and the rewind unit. The function of these two units is to take up and release excess substrate material as the chuck is moved over some or all of its full travel in the web direction without impeding the accuracy and speed of the stage, without imparting sufficient drag to the web to cause the length of substrate vacuum clamped to the chuck to move with respect to the chuck surface and without damaging the substrate or any unprocessed or processed film on the substrate. The length compensator units are required to perform most intensively when the apparatus is operating in raster scan mode along the web where the chuck makes a series of continuous moves along the full length of its travel. In this case the length compensator units may be required to repeatedly take up and release slack web material at speeds up to 1 m per second. In practice the length compensator units will most likely consist of an arrangement of closely spaced parallel rollers where one moveable roller is situated between two fixed rollers such that when the moveable roller is displaced with respect to the fixed rollers some length of web is taken up or dispensed. If the rollers are spaced such that the web lengths on each side of the moveable roller are parallel then the length of web released or taken up is equal to twice the travel distance of the roller. Either passive or active movement of the roller is possible. In the passive case the roller relies on gravity to maintain web tension. In the active case the roller is driven up or down by a mechanism that incorporates a web tension sensor. Other arrangements for web length compensator units with are possible. Units with one or multiple moving rollers mounted either horizontally or vertically can be used to suit the particular requirement.

A variety of different patterning units can be attached to the process head. These include:—
1. An optical system for directly focussing or imaging a pulsed laser beam onto the web surface for ablation of thin films on the substrate
2. A scanner and f-theta lens system for focussing or imaging a pulsed laser beam onto the web surface for ablation of thin films on the substrate
3. An optical system for directly focussing or imaging a CW or quasi CW laser beam onto the substrate surface for thin film curing or photo exposure.
4. A scanner and f-theta lens system for focussing or imaging a CW or quasi CW laser beam onto the substrate surface for thin film curing or photo exposure.
5. A drop on demand ink jet print head that forms a pattern on the substrate surface by applying a thin layer of material in the form of continuous areas or fine lines
6. A continuous flow ink jet print head that forms a pattern on the substrate surface by applying a thin layer of material in the form of fine lines.
7. A drying head that sets ink jet printed droplets on the substrate by thermal or UV curing processes
8. A mechanical scriber head that scribes isolation lines in thin films on the substrate surface.

Multiple heads of the same type or combinations of heads of different type can be used on the apparatus.

The process heads can be used to pattern the thin film on the substrate surface in several different modes using either synchronous, continuous motions of both the process unit and the chuck or by a series of continuous motions of one of either the process head or the chuck in either direction combined with a series of intermittent motions of the other in either direction or by a series of intermittent motions by both the chuck and the process head. If the process unit contains one or more focussing type laser beam delivery units the full area of the defined length of web is processed by either synchronous, continuous motions of both the laser head and the chuck or by a series of continuous motions of one of either the laser head or the chuck in either direction combined with a series of intermittent motions of the other in either direction. If the process unit contains one or more laser beam delivery units consisting of 2D scanner and lens units the full area of the defined length of substrate can be processed by the laser units in step and scan mode with a series of intermittent motions of both the process unit and the chuck in either direction. An alternative arrangement with 2D scanner and lens units is possible. In this case the full area of the defined length of substrate is processed in bands in raster mode by a series of continuous motions of one of either the scanner and lens unit or the chuck in either direction combined with a series of intermittent motions of the other in either direction.

Where the process unit contains one or more drop on demand ink jet print heads these can be operated in two ways. When the heads are operated with continuous droplet flow from a limited number of nozzles a series of parallel lines of deposited material are created. The pitch of the lines can be adjusted coarsely by selection of the pitch of the nozzles used and can be set to an exact value by tilting the ink jet head with respect to the movement direction to reduce the effective pitch to that required. Alternatively when all of the nozzles in the print head are in operation with digital modulated droplet firing the full area of the defined length of substrate is processed in raster mode in a series of parallel bands by a series of continuous motions of one of either the ink jet head or the chuck in either direction combined with a series of intermittent motions of the other in either direction. Such raster mode ink jet processing enables completely registered two dimensional patterns over the full substrate area to be created.

Rather than drop on demand print heads the process unit may contain one or more continuous flow ink jet print heads. Such heads are ideal for creating line patterns in deposited ink material. In this case the full area of the defined length of substrate is processed in a series of parallel lines of deposited material by a series of continuous motions of one of either the ink jet head or the chuck in either direction combined with a series of intermittent motions of the other in either direction.

Accurate registration of the new applied pattern to any existing pattern on the substrate is one of the most important aspects of this invention since many of the microelectronic device manufacturing operations for which this apparatus is suitable require the accurate superposition of a pattern in one layer of material on top of one or more underlying patterned layers. This is achieved in practice by performing a pre-process alignment procedure using one or more camera units attached to the process unit. The cameras view the substrate surface and are fitted with suitable optics and illumination sources for observation of existing patterns or fiducial marks on the substrate. By programmed motion of the two servo motor driven stages in the X and Y axes any point on the area of the substrate clamped to the chuck can be accessed by the camera units for fiducial or reference mark position identification. At each alignment mark location the exact position of the mark in a camera field of view is recorded and the offset of the mark from a reference position calculated. After the exact locations of two or more marks on each discrete substrate area have been identified the angular and spatial displacements of the area of web on the chuck to be processed can be calculated and corrections introduced into the program that controls the motions of the process unit and chuck.

Since the web is flexible and will be subject to multiple handling and processing operations it is possible that the area of the substrate to be processed may become distorted. The length and width may both change by small amounts and the area may even become non-linearly distorted. These substrate distortion effects may all be compensated for by using the alignment camera or cameras to locate the exact position of a sufficient number of alignment marks on the substrate area to allow calculation of the exact shape followed by corrections to the motion of the process unit and the chuck in order to match the new pattern exactly to the existing distorted pattern.

A vital part of the proposed apparatus is the control system that allows programmed, co-ordinated motion of the process unit and the chuck and also operation of the web length compensators and the unwind and rewind units. The system also needs to be able to capture data from the alignment cameras, identify the fiducial mark offsets, calculate the shape and location of the existing pattern on the substrate and make corrections to the program controlling the chuck and process head servo motors so that the new pattern exactly overlays the existing one. The control system also needs to control the triggering of the pulses from the laser or lasers used for film ablation, the gating of the laser beam or beams used for film exposure or curing, the operation of the deflection mirrors in the beam scanner unit or units, the firing of the droplets from the drop on demand ink jet head or heads and the deflection of the droplets from the continuous flow inkjet head or heads.

In the case where the process unit contains an ink jet head of some type it is possible that there will be a requirement on the apparatus to carry out some drying of the deposited ink materials by a photo curing or thermal curing process after the processed length of substrate has been released from the chuck and advanced towards the rewind drum. If such a unit is required it can be located in two different positions; between the chuck and the rewind side web length compensator or between the rewind web length compensator and the rewind drum. If the unit is placed between the chuck and the web length compensator unit and if it is required to cure a length of processed web material at the same time as further material is being processed on the chuck then the cure unit will be situated over web material that is moving in the web direction and the length of the cure unit along the web direction needs to be sufficient to accommodate the length of processed material as well as the travel length of the chuck during the process. In practice this means that for the case where the process time exceeds the cure time a cure unit that is at least twice as long as the process area length is required. If the cure time exceeds the process lime then a longer cure unit is required. The cure unit is likely to have a length that is some multiple of the process length with the minimum multiple being two for the case that it is located over web material that is in motion during substrate processing.

Placement of the thermal or UV dryer unit between the web length compensator unit and the rewind drum is possible if the material applied by the ink jet heads can be run in an uncured state through the length compensator unit. This location is advantageous since it is situated over web material that is stationary while further material on the chuck is being processed. This means that so long as the curing time is less than the process time the length of the cure unit in the X direction need only just exceed the length of the process area Clearly for the case where the cure time exceeds the process time the length of the cure unit needs to be longer. The cure unit is likely to have a length that is some multiple of the process length with the minimum multiple being one for the case that it is located over web material that is stationary during substrate processing.

The dryer unit may well be of such a type that when not in use it moves to a docking position away from the web to avoid unnecessary web heating.

BRIEF DESCRIPTION OF DRAWINGS

Aspects of the apparatus will now be described with reference to the accompanying drawings of which.

DETAILED DESCRIPTION OF DRAWINGS

FIG. 1

Figure 1:
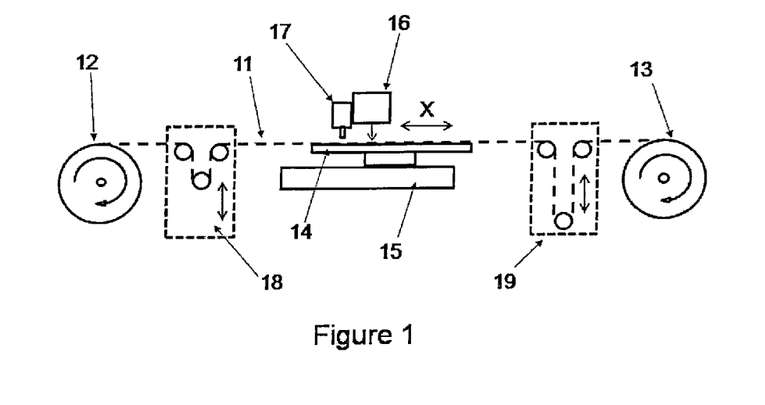
FIG. 1 shows a side view of the apparatus.

FIG. 1 shows a side view of the proposed apparatus showing a continuous web of flexible material 11 that is periodically unwound from a unwind drum or reel 12 on one side of the apparatus and periodically rewound onto an rewind drum or reel 13 on the other side of the apparatus. In the figure, the unwind unit and rewind unit are both shown to rotate clockwise so that the web is periodically advanced from left to right. Both units are driven by servo motors and have feedback from web tension sensors, which are not shown, in order to maintain an appropriate tension in the web at all times. The apparatus has a flat chuck 14 which is attached to a servo motor driven stage 15 so that it can move in an accurately controlled way in the X direction parallel to the web movement direction. The apparatus has a process unit 16 that is attached to a carriage on a servo motor driven stage on a gantry over the web. The direction of travel of the stage carrying the process head is in a direction Y which is orthogonal to the X direction and directed perpendicular to the paper in the figure. The process unit has a camera unit 17 attached to it for observation of existing patterns or fiducial marks on the substrate. By programmed motion of the two servo motor driven stages in the X and Y axes any point on the area of the substrate clamped to the chuck can be accessed for processing by the process unit or for fiducial mark position identification by the camera. A web length compensator unit 18 is situated between the unwind unit and the chuck assembly to take up and release any slack unprocessed substrate material arising due to the motion of the chuck and attached substrate in the X direction. A second web length compensator unit 19 is situated between the chuck assembly and the rewind unit to take up and release any slack processed substrate material arising due to the motion of the chuck and attached substrate in the X direction.

FIG. 2

Figure 2:
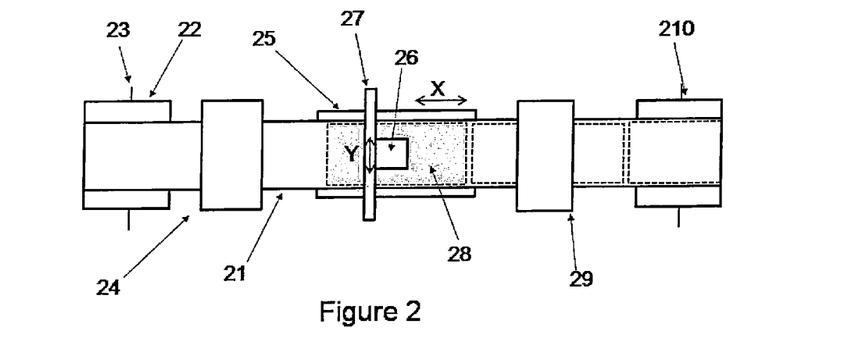
FIG. 2 shows a top view of the apparatus

FIG. 2 shows a top view of the proposed apparatus showing a continuous web, of flexible material 21 that is unwound on one side of the apparatus from an unwind drum or reel 22 which rotates on an axle 23. The web passes through a "web length compensator" unit 24 before passing over the process chuck 25 which is able to travel in the X direction parallel to the web travel direction. A defined length of the substrate is vacuum clamped to the chuck surface for processing. A process unit 26 is attached to a carriage on a stage on a gantry 27 over the web. The stage is servo motor controlled and causes the process head to move across the full width of the web in the Y direction. By coordinated motion of the pair of stages the full area 28 of the defined length of substrate clamped to the chuck is accessible to the process unit and can be processed. After processing is complete the vacuum on the chuck is released and the web is advanced by a control unit that causes the unwind and rewind units to activate. After passing through a second web length compensator unit 29 the web is eventually rewound onto a rewind drum or reel 210. In the figure, the unwind unit and rewind unit are both shown to rotate such that the web is periodically advanced from left to right.

FIG. 3

Figure 3:
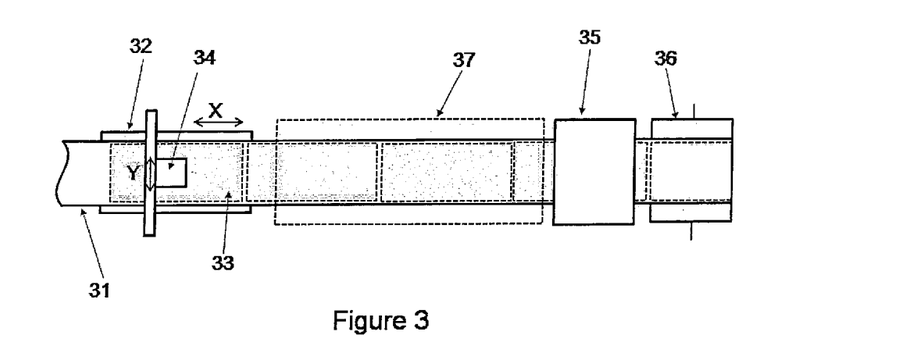
FIG. 3 shows a variation of the apparatus to allow post process curing

FIG. 3 shows the rewind side of the apparatus indicating how a post process cure unit can be placed. The flexible web 31 is unwound from a drum via a web length compensator unit which are not shown in the figure. After clamping to the chuck 32 an area of substrate 33 is processed by process unit 34 by combined movement of the process head and the chuck in the X and Y axes. Slack web material released or taken up when the chuck moves in the X direction is accommodated by the length compensator unit 35. Rewind drum 36 is held stationary during substrate processing but is activated to rewind a defined length of the web when the processed area is released from the chuck. A post process cure unit 37 for photo or thermal curing of material deposited by ink jet printing is located between the chuck and the length compensator unit.

Placement at this location means that the cure unit is situated over web material that is moving in the X direction while further material on the chuck is being processed so the length of the cure unit needs to be longer than the processed web length.

FIG. 4

Figure 4:
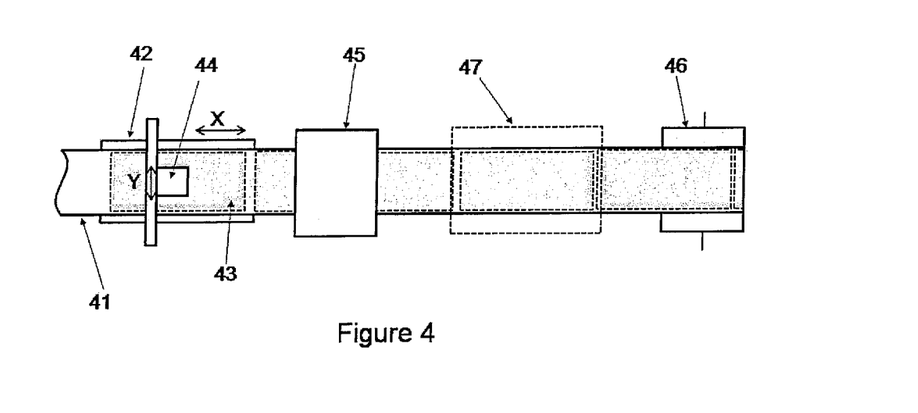
FIG. 4 shows an alternative version of the apparatus to allow post process curing

FIG. 4 shows the further view of the rewind side of the apparatus indicating an alternative way that a post process cure unit can be placed. The flexible web 41 is unwound from a drum via a length compensator unit which are not shown in the figure. After clamping to the chuck 42 an area of substrate 43 is processed by process unit 44 by combined movement of the process head and the chuck in the X and Y axes. Slack web material released or taken up when the chuck moves in the X direction is accommodated by the length compensator unit 45. Rewind drum 46 is held stationary during substrate processing but is activated to rewind a defined length of the web when the processed area is released from the chuck. A thermal or UV cure unit 47 is located between the length compensator unit and the rewind drum. Placement at this location is advantageous since it is situated over web material that is stationary while further material on the chuck is being processed. This means that so long as the curing time is less than the process time the length of the cure unit in the X direction need only just exceed the length of the process area.

In the apparatus described above, two axes of motion are provided, eg the process head moves orthogonally to the chuck to position the beam at various points across the substrate and the chuck is moved parallel to the length of the substrate. The apparatus thus enables the processing to be carried out by vector writing so that processing is carried out only in the places that need processing. This is more efficient if only relatively small areas of the substrate need processing.

In the apparatus described, the movement in the two axes may be in different modes: (1) both together continuously or (2) one continuous and the other intermittent or (3) both intermittently. Also, reciprocating motion is provided in at least one direction, eg by movement of the process unit backwards and forwards across the width of the substrate.

The arrangements described above thus provide apparatus for processing long, continuous lengths of a flexible foil substrate in discrete defined lengths in order to create high resolution, 2D patterns with a high level of positional accuracy by mask less, direct write methods in thin films on the material, in which the apparatus comprises:

a unit for periodically dispensing a defined discrete length of the unprocessed flexible substrate from a cylindrical drum in a first direction for processing while maintaining constant tension in the substrate in the first direction;

a unit for accommodating all substrate length changes in the first direction and maintaining constant tension in the first direction in the discrete length of dispensed unprocessed substrate as the length varies due to the end nearer the drum being held stationary and the other end being caused to move during processing;

a flat plate chuck onto which a discrete length of the flexible substrate is periodically clamped by vacuum for processing;

a mechanism for accurately moving the chuck and attached discrete length of substrate in the first direction one or more times over the full length of the discrete substrate in either direction in continuous or intermittent reciprocating motion during processing;

a process unit mounted over the chuck;

a maintenance docking position for the process unit;

a mechanism for accurately moving the process unit one or more times in a second direction which is perpendicular to the first direction over the full extent of the substrate in the second direction the motion being in either direction in continuous or intermittent reciprocating motion during processing;

a unit for accommodating all length changes and maintaining constant tension in the first direction in the discrete length of processed substrate as the length varies due to one end being held stationary and the other end being caused to move during processing;

a unit for periodically rewinding a defined discrete length of the flexible substrate onto a cylindrical drum in the first direction after processing while maintaining constant tension in the substrate in the first direction; a control system that:— periodically clamps a defined discrete length of the substrate to the chuck for processing and then allows accurate motion of the chuck in the first direction while keeping the unwind and rewind drums stationary;

allows the process unit to be accurately positioned at any point across the width of the web in the second direction;

moves the chuck and process unit by means of either synchronous, continuous motion of both the process unit and the chuck or by a series of continuous motions of one of either the process unit or the chuck in either direction combined with a series of intermittent motions of the other in either direction; operates the process unit;

periodically unclamps the processed discrete length of substrate from the chuck and simultaneously operates the unwind and rewind drum units in order to rewind a length of substrate containing the full length of the processed area and unwind a defined discrete length of unprocessed substrate, the defined length of unprocessed substrate being unwound being the same or different to that being rewound

The invention claimed is:

1. An apparatus for processing long, continuous lengths of a flexible substrate in discrete defined lengths in order to form high resolution, two-dimensional patterns with a high level of positional accuracy by direct writing on the substrate, said apparatus comprising;

a. a dispensing unit for periodically dispensing a defined length of the flexible substrate from an unwind drum in a first direction while maintaining constant tension in the substrate in the first direction;

b. a chuck onto which a discrete defined length of the substrate is periodically clamped for processing;

c. a first accommodating unit for accommodating length changes in the first direction and maintaining constant tension in the first direction in the substrate upstream of the chuck;

d. a first mechanism for accurately moving the chuck and attached discrete length of substrate backwards and forwards in the first direction one or more times over the full length of the discrete length of substrate;

e. a processing unit mounted over the chuck for forming a high resolution two-dimensional pattern on the defined length of the substrate by a direct writing process;

f. a second mechanism for accurately moving the process unit one or more times backwards and forwards in a second direction which is perpendicular to the first direction over the full width of the substrate;

g. a second accommodating unit for accommodating length changes and maintaining constant tension in the first direction in the defined length of substrate downstream of the chuck;

h. a rewinding unit for periodically rewinding a defined length of the flexible substrate onto a rewind drum in the first direction after processing while maintaining constant tension in the substrate in the first direction; and i. a control system arranged to control:
  i. periodic clamping of a discrete defined length of the substrate to the chuck so that the discrete defined length of the substrate is held stationary relative to the chuck during processing of the discrete defined length of the substrate by the processing unit, and movement of the chuck in the first direction while the unwind and rewind drums are stationary and the discrete defined length of the substrate remains clamped to the chuck;
  ii. movement of the chuck and the discrete defined length of the substrate clamped to the chuck and processing unit either by means of synchronous, continuous motion of both the chuck and the processing unit or by a series of continuous motions of one of the chuck and the processing unit in one direction combined with a series of intermittent motions of the other in the other direction;
  iii. operation of the processing unit;
  iv. periodic unclamping of the discrete defined length of substrate from the chuck so as to allow the discrete defined length of substrate to move relative to the chuck and be moved off the chuck, and operation of the unwind and rewind drums so as to rewind the defined length of substrate onto the rewind drum and unwind a further defined discrete length of substrate from the dispensing drum.

2. The apparatus as in claim 1 wherein the processing unit comprises one or more optical devices for directing laser beams onto the surface of the substrate in order to create a fine pattern therein by a process of ablation.

3. The apparatus as in claim 1 wherein the processing unit comprises one or more optical devices for directing laser beams onto the surface of the substrate in order to create a fine pattern therein by a process of photo-exposure or thermal curing.

4. The apparatus as in claim 1 wherein the processing unit comprises one or more drop on demand ink jet print heads for forming a pattern on the substrate surface by depositing micro fluidic packets of functional or non-functional material that coalesce to form continuous areas or fine lines.

5. The apparatus as in claim 1 wherein the processing unit comprises of one or more continuous flow ink jet print heads for forming a pattern on the substrate surface by depositing micro fluidic packets of functional or nonfunctional material that coalesce to form fine lines.

6. The apparatus as in claim 4, wherein the ink jet print heads are arranged to deposit micro fluidic packets of electrically conducting, semiconducting, or non-conducting functionality and are of organic, inorganic, metallic or organo-metallic type.

7. The apparatus as in claim 1, wherein the processing unit comprises a combination of laser heads, ink jet print heads and drying heads.

8. The apparatus as in claim 1, wherein the processing unit comprises one or more laser beam delivery units and the control system is arranged to control the combined motion of the chuck and processing unit so that the full area of the defined length of substrate is processed by either synchronous, continuous motions of both the processing unit and the chuck or by a series of continuous reciprocating motions of one of either the processing head or the chuck in one direction combined with a series of intermittent motions of the other in the other direction.

9. The apparatus as in claim 1, wherein the processing unit comprises one or more laser beam delivery units and these comprise a two-dimensional scanner and lens units and the control system is arranged to control the combined motion of the chuck and processing head so that the full area of the defined length of substrate is processed by the laser units in step and scan mode with a series of intermittent motions of both the processing unit and the chuck in either direction.

10. The apparatus as in claim 1, wherein the processing unit comprises one or more laser beam delivery units and these comprise a two-dimensional scanner and lens units and the control system is arranged to control the combined motion of the chuck and processing head so that the full area of the defined length of substrate is processed in bands in raster mode by a series of continuous reciprocating motions of one of either the processing head or the chuck in one direction combined with a series of intermittent motions of the other in the other direction.

11. The apparatus as in claim 1, wherein the processing unit comprises one or more drop on demand ink jet print heads that are operable with continuous droplet flow from a limited number of nozzles and the control system is arranged to control the combined motion of the chuck and process head so that the full area of the defined length of substrate is processed in a series of parallel bands consisting of parallel lines of deposited material by a series of continuous reciprocating motions of one of either the processing head or the chuck in one direction combined with a series of intermittent motions of the other in the other direction.

12. The apparatus as in claim 1, wherein the processing unit comprises one or more drop on demand ink jet print heads that are operable with modulated droplet flow from all nozzles and the control system is arranged to control the combined motion of the chuck and process head so that the full area of the defined length of substrate is processed in raster mode in a series of parallel bands by a series of continuous reciprocating motions of one of either the processing head or the chuck in one direction combined with a series of intermittent motions of the other in the other direction.

13. The apparatus as in claim 1, wherein the processing unit comprises one or more continuous flow ink jet print heads that are operable with continuous droplet flow onto the substrate and the control system is arranged to control the combined motion of the chuck and processing head so that the full area of the defined length of substrate is processed in a series of parallel lines of deposited material by a series of continuous reciprocating motions of one of either the processing head or the chuck in one direction combined with a series of intermittent motions of the other in the other direction.

14. The apparatus as in claim 1, wherein the processing unit comprises one or more cameras for identifying the position of the fiducial marks on the substrate when clamped to the chuck so that the processing unit can be accurately positioned relative to the substrate.

15. A method of processing long, continuous lengths of a flexible substrate in discrete defined lengths to form high resolution, two-dimensional patterns with a high level of positional accuracy by direct writing on the substrate, the method comprising;
  a. operating a dispensing unit to periodically dispense a defined length of the flexible substrate from an unwind drum in a first direction while maintaining constant tension in the substrate in the first direction;

b. providing a chuck onto which a discrete defined length of the substrate is periodically clamped for processing;
c. accommodating length changes in the first direction and maintaining constant tension in the first direction in the substrate upstream of the chuck;
d. moving the chuck and attached discrete length of substrate backwards and forwards in the first direction one or more times over the full length of the discrete length of substrate;
e. providing a processing unit over the chuck to form a high resolution two-dimensional pattern on the defined length of the substrate by a direct writing process;
f. accurately moving the process unit one or more times backwards and forwards in a second direction which is perpendicular to the first direction over the full width of the substrate;
g. accommodating length changes and maintaining constant tension in the first direction in the defined length of substrate downstream of the chuck;
h. periodically rewinding a defined length of the flexible substrate onto a rewind drum in the first direction after processing while maintaining constant tension in the substrate in the first direction; and
i. providing a control system to control:
  i. periodic clamping of a discrete defined length of the substrate to the chuck so that the discrete defined length of the substrate is held stationary relative to the chuck during processing of the discrete defined length of the substrate by the processing unit, and movement of the chuck in the first direction while the unwind and rewind drums are stationary and the discrete defined length of the substrate remains clamped to the chuck;
  ii. movement of the chuck and the discrete defined length of the substrate clamped to the chuck, and processing unit either by means of synchronous, continuous motion of both the chuck and the processing unit or by a series of continuous motions of one of the chuck and the processing unit in one direction combined with a series of intermittent motions of the other in the other direction;
  iii. operation of the processing unit; and
  iv. periodic unclamping of the discrete defined length of substrate from the chuck so as to allow the discrete defined length of substrate to move relative to the chuck and be moved off the chuck, and operation of the unwind and rewind drums so as to rewind the defined length of substrate onto the rewind drum and unwind a further defined discrete length of substrate from the dispensing drum.

16. The method as in claim 15 in which the substrate comprises thin films which are exposed, cured or ablated by laser, the thin films having either electrically conducting, semiconducting, or non-conducting functionality and being of organic, inorganic, metallic or organo-metallic type.

\* \* \* \* \*